United States Patent
Yeung et al.

(10) Patent No.: US 6,335,636 B1
(45) Date of Patent: Jan. 1, 2002

(54) PROGRAMMABLE LOGIC DEVICE INPUT/OUTPUT CIRCUIT CONFIGURABLE AS REFERENCE VOLTAGE INPUT CIRCUIT

(75) Inventors: Wayne Yeung, San Francisco; Chiakang Sung, Milpitas; Myron W. Wong, Fremont; Khai Nguyen, San Jose; Bonnie I. Wang, Cupertino; Xiaobao Wang, Santa Clara; Joseph Huang; Im Whan Kim, both of San Jose, all of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/846,409

(22) Filed: May 1, 2001

Related U.S. Application Data

(63) Continuation of application No. 09/366,937, filed on Aug. 4, 1999.
(60) Provisional application No. 60/118,203, filed on Feb. 1, 1999, now abandoned, provisional application No. 60/107,102, filed on Nov. 4, 1998, and provisional application No. 60/099,600, filed on Sep. 9, 1998.

(51) Int. Cl.[7] .......................... H01L 25/00; G06F 13/00
(52) U.S. Cl. .......................... 326/41; 326/38; 710/103
(58) Field of Search .............................. 326/41, 47, 38, 326/83; 710/103

(56) References Cited

U.S. PATENT DOCUMENTS

| | | | |
|---|---|---|---|
| 4,494,021 A | 1/1985 | Bell et al. | 307/591 |
| 4,527,079 A | 7/1985 | Thompson | 326/475 |
| 4,633,488 A | 12/1986 | Shaw | 375/120 |
| 4,658,156 A | 4/1987 | Hashimoto | 307/350 |
| 4,719,593 A | 1/1988 | Threewitt et al. | 364/900 |
| 4,853,560 A | 8/1989 | Iwamura et al. | 307/296.1 |
| 4,868,522 A | 9/1989 | Popat et al. | 331/2 |
| 4,959,646 A | 9/1990 | Podkowa et al. | 340/825.83 |
| 5,059,835 A | 10/1991 | Lauffer et al. | 307/576 |
| 5,072,195 A | 12/1991 | Graham et al. | 331/2 |

(List continued on next page.)

FOREIGN PATENT DOCUMENTS

| | | |
|---|---|---|
| EP | 0 266 065 | 9/1987 |
| EP | 0 575 124 | 12/1993 |
| JP | 1-137646 | 5/1989 |

OTHER PUBLICATIONS

Advanced Micro Devices, Inc., "Am2971 Programmable Event Generator (PEG)," Publication No. 05280, Rev. C, Amendment/0, pp. 4–286–4–303 (Jul. 1986).
Advanced Micro Devices, Inc., "AmPAL*22S8 20–Pin IMOX PAL–Based Sequencer," Publication No. 06207, Rev. B, Amendment/0, pp. 4–102–4–121 (Oct. 1986).
DynaChip Corp., "Application Note: Using Phase Locked Loops in DL6035 Devices" (1998), pp. 1–6.

(List continued on next page.)

Primary Examiner—Michael Tokar
Assistant Examiner—Daniel D. Chang
(74) Attorney, Agent, or Firm—Fish & Neave; Jeffrey H. Ingerman

(57) ABSTRACT

A programmable input/output circuit for a programmable logic device input/output pin can be configured in a standard I/O mode, or in a reference voltage mode. The circuit includes a tristatable, but otherwise standard I/O buffer as well as a reference voltage clamp circuit. In reference voltage mode, the I/O circuit is tristated, and the reference voltage clamp circuit passes a reference voltage from the I/O pin to a reference voltage bus. In standard I/O mode, the I/O buffer is operational. The reference voltage clamp circuit isolates the I/O pin from the reference voltage bus and may include undervoltage and overvoltage protection to prevent disturbance of the reference voltage bus by an out-of-range I/O signal.

11 Claims, 5 Drawing Sheets

U.S. PATENT DOCUMENTS

| | | | |
|---|---|---|---|
| 5,075,575 A | 12/1991 | Shizukuishi et al. | 307/465 |
| 5,079,519 A | 1/1992 | Ashby et al. | 331/1 A |
| 5,133,064 A | 7/1992 | Hotta et al. | 395/550 |
| 5,144,167 A | 9/1992 | McClintock | 307/475 |
| 5,204,555 A | 4/1993 | Graham et al. | 307/465 |
| 5,349,544 A | 9/1994 | Wright et al. | 364/600 |
| RE34,808 E | 12/1994 | Hsieh | 326/71 |
| 5,397,943 A | 3/1995 | West et al. | 326/39 |
| 5,418,499 A | 5/1995 | Nakao | 331/57 |
| 5,420,544 A | 5/1995 | Ishibashi | 331/11 |
| 5,506,878 A | 4/1996 | Chiang | 377/39 |
| 5,521,530 A | 5/1996 | Yao et al. | 326/80 |
| 5,557,219 A | 9/1996 | Norwood et al. | 326/49 |
| 5,589,783 A | 12/1996 | McClure | 326/71 |
| 5,646,564 A | 7/1997 | Erickson et al. | 327/158 |
| 5,699,020 A | 12/1997 | Jefferson | 331/17 |
| 5,742,178 A | 4/1998 | Jenkins, IV et al. | 326/33 |
| 5,742,180 A | 4/1998 | DeHon et al. | 326/40 |
| RE35,797 E | 5/1998 | Graham et al. | 326/40 |
| 5,777,360 A | 7/1998 | Rostoker et al. | 257/315 |
| 5,801,548 A | 9/1998 | Lee et al. | 326/44 |
| 5,815,016 A | 9/1998 | Erickson | 327/158 |
| 5,847,617 A | 12/1998 | Reddy et al. | 331/57 |
| 5,877,632 A | 3/1999 | Goetting et al. | 326/50 |
| 5,936,423 A | 8/1999 | Sakuma et al. | 326/16 |
| 5,958,026 A | 9/1999 | Goetting et al. | 710/52 |
| 5,970,255 A | 10/1999 | Tran et al. | 395/893 |
| 6,049,227 A | 4/2000 | Goetting et al. | 326/80 |
| 6,118,302 A | 9/2000 | Turner et al. | 326/68 |
| 6,175,952 B1 | 1/2001 | Patel et al. | 716/18 |

OTHER PUBLICATIONS

DynaChip Corp., DY6000 Family Datasheet (Dec. 1998), pp. 1–66.

Ko, U., et al., "A 30–ps Jitter, 3.6 µs Locking, 3.3–Volt Digital PLL for CMOS Gate Arrays," *Proceedings of the IEEE 1993 Custom Integrated Circuits Conference*, Publication No. 0–7803–0826–3/93, pp. 23.3.1–23.3.4 (May 9–12, 1993).

LSI Logic Corp., 500K Technology Design Manual (Document DB04–000062–00, First Edition), pp. 8–1–8–33 (Dec. 1996).

Lucent Technologies, Inc., Optimized Reconfigurable Cell Array (ORCA®) OR3Cxxx/OR3Txxx Series Field–Programmable Gate Arrays, Preliminary Product Brief, (Nov. 1997), pp. 1–8.

Lucent Technologies, Inc., ORCA® Series 3 Field–Programmable Gate Arrays, Preliminary Data Sheet, Rev. 01 (Aug. 1998), pp. 1–80.

Monolithic Memories, Inc., "Programmable Array Logic PAL20RA10–20 Advance Information," pp. 5–95–5–102 (Jan. 1988).

National Semiconductor Corp., *LVDS Owner's Manual & Design Guide* (Apr. 25, 1997), pp. 1–7.

National Semiconductor Corp., "DS90CR285/DS90CR286 +3.3V Rising Edge Data Strobe LVDS 28–Bit Channel Link–66 MHZ," (Mar. 1998), pp. 1–16.

Xilinx, Inc., Virtex 2.5V Field Programmable Gate Arrays Advance Product Specification (Version 1.0) (Oct. 20, 1998), pp. 1–24.

Xilinx, Inc., Application Note: Using the Virtex Delay––Locked Loop (Version 1.31) (Oct. 21, 1998), pp. 1–14.

Zaks, R., et al., *From Chips to Systems: An Introduction to Microcomputers*, pp. 54–61 (Prentice–Hall, Inc., Englewood Cliffs, N.J., 1987).

Patel, R., et al., "A 3.3–V Programmable Logic Device that Addresses Low Power Supply and Interface Trends," *IEEE 1997 Custom Integrated Circuits Conference,* May 1997, pp. 539–42.

PROGRAMMABLE LOGIC DEVICE INPUT/OUTPUT CIRCUIT CONFIGURABLE AS REFERENCE VOLTAGE INPUT CIRCUIT

CROSS REFERENCES TO RELATED APPLICATIONS

This is a continuation of copending, commonly-assigned U.S. patent application Ser. No. 09/366,937, filed Aug. 4, 1999, which claims the benefit of U.S. Provisional Patent Application No. 60/118,203, filed Feb. 1, 1999, now abandoned, Provisonal Application No. 60/099,600, filed Sep. 9, 1998 and Provisional Application No. 60/107,102, filed Nov. 4, 1998.

BACKGROUND OF THE INVENTION

This invention relates to an input/output circuit for a programmable logic device, and more particularly to an input/output circuit that is configurable to be used either as a reference voltage input circuit to accommodate different logic standards with different voltage requirements, or as an ordinary input/output circuit.

Programmable logic devices are well known. Commonly, a programmable logic device has a plurality of substantially identical logic elements, each which can be programmed to perform certain desired logic functions. The logic elements have access to a programmable interconnect structure that allows a user to interconnect the various logic elements in almost any desired configuration. Finally, the interconnect structure also provides access to a plurality of input/output ("I/O") pins, with the connections of the pins to the interconnect structure also being programmable.

At one time, programmable logic devices of the type just described were implemented almost exclusively using transistor-transistor logic ("TTL"), in which a logical "high" signal was nominally at 5 volts, while a logical "low" signal was nominally at ground potential, or 0 volts. More recently, however, other logic standards have come into general use, some of which use different signalling schemes, such as LVTTL (Low Voltage TTL, which exists in a 3.3-volt version or a 2.5-volt version), PCI (Peripheral Component Interface, which requires a 3.3-volt power supply), SSTL (Series Stub Terminated Logic, which has several variants), GTL (Gunning Transceiver Logic) or GTL+, HSTL (High Speed Transceiver Logic, which has several variants), LVDS (Low Voltage Differential Signalling), and others. Not only might these signalling schemes use different voltage levels for a "high" signal, and therefore require different supply voltages (the power supply requirements for these various standards may be 5.0 volts, 3.3 volts, 2.7 volts, 2.5 volts, 1.8 volts or 1.5 volts), but some of them, such as GTL/GTL+, various variants of SSTL and HSTL, and other standards such as CTT, ECL and 3.3V AGP, may require a source of reference voltage. Typically, reference voltage would be supplied externally, using a suitable pin, which may be a dedicated reference voltage input pin, or may be a programable pin which can be programmably selected to function as a reference voltage input pin, or as another kind of pin, such as an I/O pin.

Because the programmable logic device is programmable, and may be used in a configuration in which a reference voltage is not needed, it is desirable to make at least some of the I/O pins programmably configurable either as reference pins or as standard I/O pins having a standard I/O driver or buffer. If a pin is configured as a standard I/O pin, it should be electronically isolated from the reference voltage bus of the programmable logic device. However care must be taken so that a noisy signal on that pin, which may fluctuate to an unexpected voltage, does not overcome that isolation and propagate to the reference voltage bus, where it may cause improper operation or even damage to circuit elements.

SUMMARY OF THE INVENTION

It is an object of this invention to attempt to provide an I/O circuit for a programmable logic device, which circuit is programmably configurable either as a standard I/O driver circuit or as a reference voltage input circuit that in the standard I/O mode protects the reference bus of the programmable logic device in the event that the I/O signal strays to an unexpected voltage value.

In accordance with the present invention, a programmable I/O circuit is provided for use in a programmable logic device that programmably accommodates a plurality of logic signalling standards, at least one of those logic signalling standards requiring a reference voltage. The programmable I/O circuit has an I/O terminal, an I/O buffer coupled to the I/O terminal for buffering I/O signals between the I/O terminal and the programmable logic device. A programmable reference voltage clamp circuit has (a) a first programmable condition in which a reference voltage is passed from the I/O terminal to the programmable logic device, with the I/O buffer being disconnected when the programmable reference voltage clamp is in that first programmable condition, and (b) a second programmable condition in which voltage on the I/O terminal is prevented from being passed through the programmable reference voltage clamp circuit, with the I/O buffer being connected in an operable condition when the programmable reference voltage clamp circuit is in that second programmable condition. The programmable reference voltage clamp circuit has a selection input for controlling when the programmable reference voltage clamp circuit is in the first programmable condition and when it is in the second programmable condition.

In a programmable logic device, or other integrated circuit, which supports a variety of logic signalling standards, some of which may require voltage references, a programmable I/O circuit can be configured as a standard I/O circuit or as a reference voltage input circuit. Such a programmable I/O circuit preferably has a standard I/O buffer which is connected to the programmable logic or other functional portion of the programmable logic or other device, as well as a circuit that can pass a reference voltage to the appropriate location on the programmable logic or other device.

By setting a programming bit or bits to a first condition, one connects the I/O buffer to the I/O pin of the circuit and disconnects the I/O pin from the reference voltage path. In that condition, the programmable I/O circuit functions as a standard I/O circuit. By setting the same programming bit or bits to a second condition, one disconnects the I/O buffer from the programmable logic or other device, while enabling the conduction from the I/O pin of a reference voltage to the appropriate location, such as a reference voltage bus, on the programmable logic or other device. Preferably, the I/O buffer is tristatable, and is disconnected by being placed in a tristated condition.

When the programmable I/O circuit is used as a standard I/O circuit, and the I/O pin is isolated from the reference voltage bus, that isolation preferably is accomplished using a reference voltage pass transistor, which preferably is a field effect transistor. As the voltage of the signal at the I/O pin fluctuates, the gate-to-source voltage across the reference voltage pass transistor may, on a transient basis, assume a state in which the transistor conducts, allowing the signal voltage onto the reference voltage bus. Thus, if the reference voltage pass transistor is an NMOS field effect transistor, the pin voltage could, on a transient basis, become sufficiently negative that the transistor conducts, even though the gate voltage is zero. Conduction by the reference voltage pass transistor could affect the reference if it is in use (a different pin would have to be configured as a reference voltage pin in that case), could damage components connected to the reference voltage bus, or could disturb the states of other pins that use the reference bus to determine their respective states.

Therefore, in accordance with the present invention, the programmable I/O circuit is provided with a reference voltage clamp circuit that pulls the reference voltage pass transistor as strongly as possible into the nonconducting state when it has been programmed to assume that state—i.e., when the programmable I/O circuit is being used as other than a reference voltage input. As described below, this clamp circuit preferably is implemented using NMOS field effect transistors. However, as the reference voltage to be passed approaches the supply voltage, the NMOS transistors will not be able to pass the reference voltage, because the gate-to-source voltage will approach zero, and will therefore be below the conduction threshold (generally 0.7 volts or less) of the transistor. Therefore, in a second preferred embodiment designed to allow a greater range of reference voltages, a parallel set of oppositely-doped (i.e., in this case, PMOS) transistors can be used, because they conduct when the gate-to-source voltage is negative.

The state of the programmable I/O circuit is controlled by a selection input, which in the case of a programmable logic device may be controlled by a RAM bit. Although ideally the selection input operates at the supply voltage of the programmable logic or other device, it may not. This would further reduce the range of possible reference voltages, because the gate-to-source voltage across the reference voltage pass transistor would be the difference between the selection input voltage and the reference voltage, rather than the supply voltage and the reference voltage. Therefore, a level shift circuit preferably is provided on the selection input, which preferably "steps up" the selection input voltage to the supply voltage if the selection input is a logical "high," but leaves the selection input voltage low if the selection input is a logical "low."

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, in which.

DETAILED DESCRIPTION OF THE INVENTION

Figure 1:
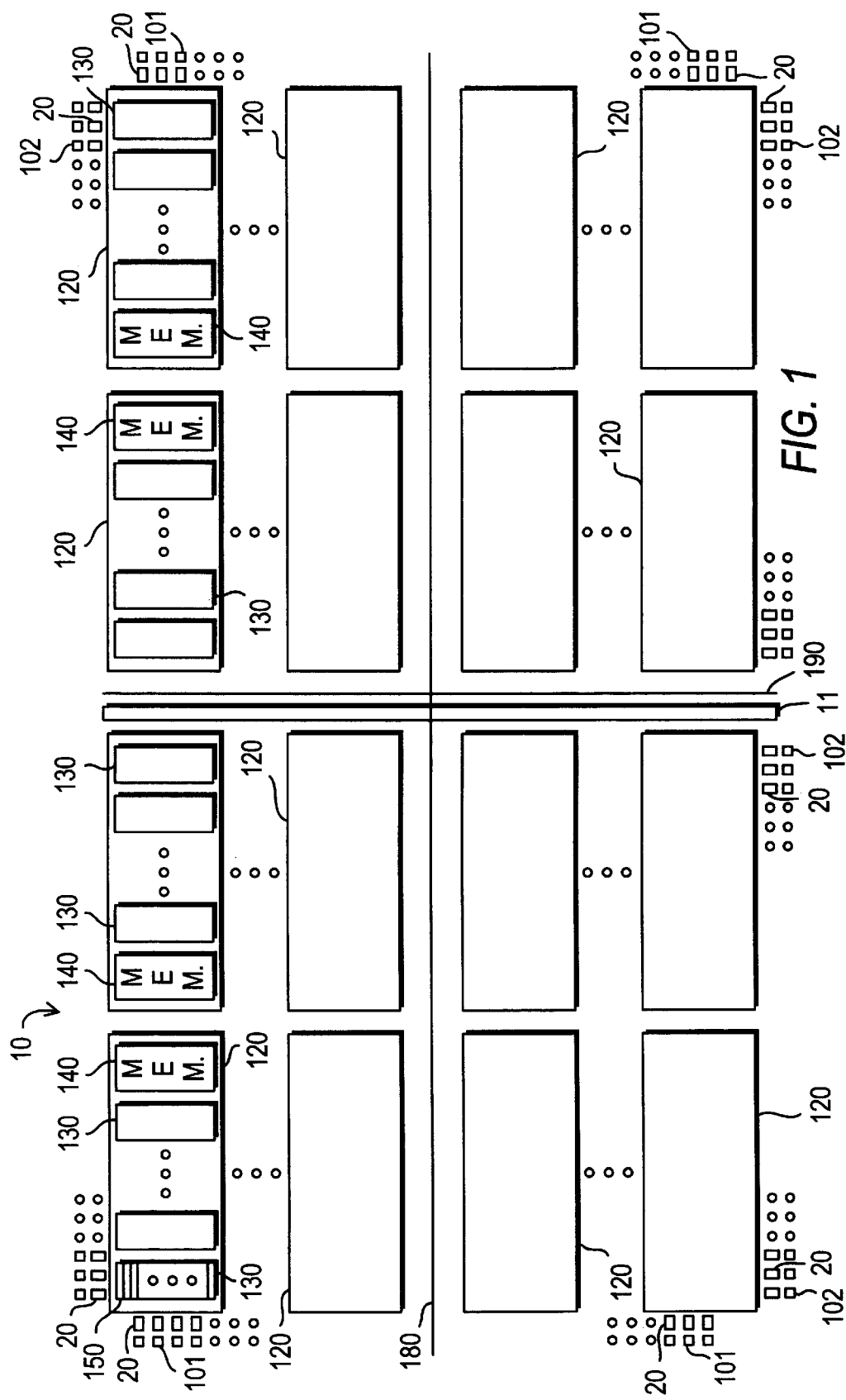
FIG. 1 is a schematic representation of a programmable logic device incorporating a programmable I/O circuit according to the present invention.

FIG. 1 shows, as an example of a device in which the present invention can be used, a programmable logic device 10 that can accommodate a plurality of different logic signalling schemes, and has a reference voltage bus therein. It should be recognized, however, that the present invention can be used with other types of programmable logic devices that use signalling schemes requiring reference voltages, whether or not they have a reference voltage bus.

The illustrative programmable logic device 10 constructed in accordance with this invention, which is described in more detail in copending, commonly-assigned U.S. patent application Ser. No. 09/266,235, filed Mar. 10, 1999, which is hereby incorporated by reference in its entirety, includes 112 super-regions 120 of programmable logic and memory disposed on the device in a two-dimensional array of 28 rows and four columns of super-regions. Each row includes four super-regions and each column includes 28 super-regions. The fourteenth row from the top is a "spare" row that is used only when it is necessary to make up for a defect in one of the thirteen rows above that spare row. Similarly, the fourteenth row from the bottom is a spare row that is used only when it is necessary to make up for a defect in one of the thirteen rows below that spare row. A certain amount of "redundancy" is thus provided on device 10.

Each super-region 120 includes a row of 16 regions 130 of programmable logic and one region 140 of memory, which the user of device 10 can use as RAM, ROM, etc.

Each logic region 130 includes a column of ten subregions 150 of programmable logic. To avoid over-crowding FIG. 1, only the extreme upper left-hand logic region 130 has its subregions 150 shown separately.

FIG. 1 also shows that each row of super-regions 120 (except the spare rows) has "horizontal" I/O pins 101 adjacent each end of the row. The top-most and bottom-most rows have four I/O pins 101 adjacent each end, while all the other non-spare rows have five I/O pins 101 adjacent each end. "Vertical" I/O pins 102 are similarly provided at each end of each column of logic regions 130. In general, two I/O pins 102 are provided at each end of each such column, except that in each super-region column only one I/O pin 102 is provided at each end of the extreme left-most and right-most column of logic regions 130.

In FIG. 1, the horizontal line 180 and the vertical line 190 divide the circuitry into four equal-sized quadrants. Lines 180 and 190 represent segmentation buffers in certain interconnection conductors as shown and described in more detail in said above-incorporated application Ser. No. 09/266,235.

A reference voltage bus 11 extends throughout device 10. Although as shown in FIG. 1, reference voltage bus 11 is located at about the center of device 10, it can be provided in any suitable location on device 10. A plurality of different types of conductors (not shown) interconnect the various super-regions and logic regions and subregions. A plurality of programmable input/output circuits 20 according to the present invention, one such programmable I/O circuit 20 for each I/O pin 101, 102, connect the various conductors (not shown) to input/output pins 101, 102. Programmable input/output circuit 20 will be described below in connection with pins 101, but relate substantially identically to pins 102.

Figure 2:
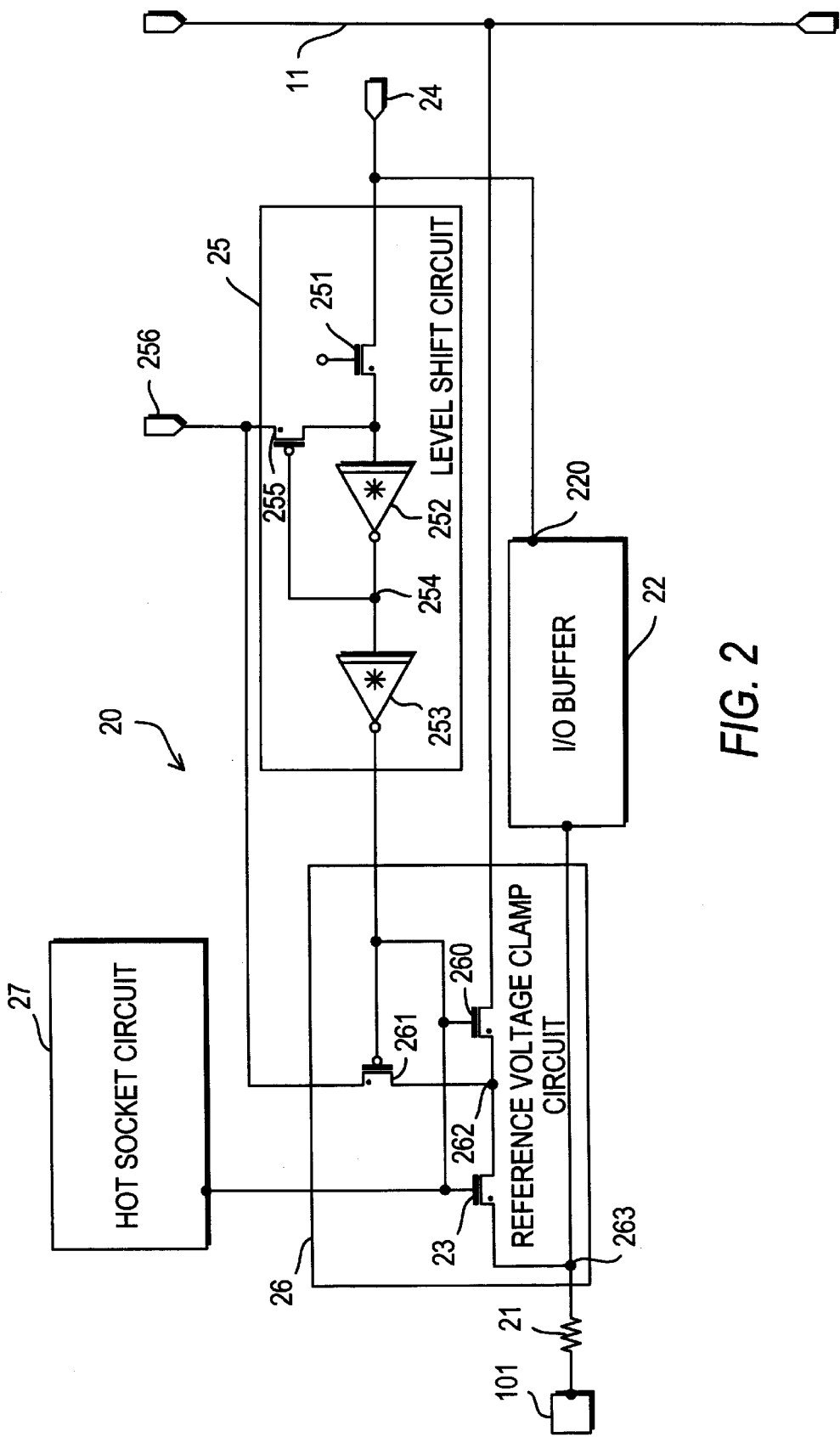
FIG. 2 is a schematic representation of a first preferred embodiment of a programmable I/O circuit according to the present invention.

As can be seen in FIG. 2, pin 101 preferably is connected through optional electrostatic discharge resistor 21 to both I/O buffer 22 and series-connected NMOS field effect transistors 23 and 260. I/O buffer 22 connects pin 101 to the various conductors for connection to one or more programmable logic regions or subregions. I/O buffer 22 is tristatable, under the control of input 220, to disconnect pin 101 from the conductors and hence from the logic regions or subregions. If both of transistors 23 and 260 are on, pin 101 is connected to reference voltage bus 11, while if either of transistors 23 and 260 is off, pin 101 is isolated from reference voltage bus 11.

Both I/O buffer 22 and transistors 23 and 260 are controlled by input 24 which preferably is stored in a configuration RAM bit on device 10 under the programmable control of the user. Thus, a logical "high" signal at input 24 would turn transistors 23 and 260 on and tristate I/O buffer 22, while a logical "low" signal at input 24 would turn transistors 23 and 260 off and allow I/O buffer 22 to operate normally.

A logical "high" signal at input 24 may be at a voltage below that of the supply voltage $V_{cc}$ of device 10. In the reference voltage mode, transistors 23 and 260 will be able to pass to reference voltage bus 11 a reference voltage that is equal to or below the difference between the gate voltage and the threshold voltages of both transistors 23 and 260 (otherwise one or both of transistors 23 and 260 will turn off). The threshold voltage is fixed (typically 0.7 volts or less); therefore, to maximize the reference voltage that can be passed, the gate voltage should be maximized. This preferably is accomplished by level shift circuit 25 which "steps up" the signal at input 24, if a logical "high," to $V_{cc}$.

Level shift circuit 25 preferably includes a pass transistor 251 in series with two inverters 252, 253. A PMOS transistor 255, whose gate preferably is controlled by node 254 between inverters 252, 253, preferably switchably connects the input of first inverter 252 to a source 256 of supply voltage $V_{cc}$. When input 24 is a logical "low," the input to first inverter 252 is low, so that the node 254 is high. That causes feedback transistor 255 to turn off, leaving the input to inverter 252 low. As a result, the output of inverter 253, which is also the output of level shift circuit 25, is low, as expected. When input 24 is a logical "high," the input to first inverter 252 is high, so that the node 254 is low. That causes feedback transistor 255 to turn on, driving the input to inverter 252 to $V_{cc}$, driving node 254 more strongly low, so that the output of inverter 253, which is also the output of level shift circuit 25, not only is high, as expected, but is at $V_{cc}$.

As discussed above, when programmable I/O circuit 20 is in reference voltage mode, the input on pin 101 is fairly stable. However, when circuit 20 is in standard I/O mode, in which transistors 23 and 260 nominally isolate pin 101 from reference voltage bus 11, the input on pin 101 may vary widely, and may, at least transiently, go sufficiently out of range to cause transistors 23 and 260 to conduct. For example, in the circuit shown in FIG. 2, the input voltage could go negative. Although optional resistor 21, if present, could drop a substantial portion of the negative voltage, enough may remain that even though the gate voltages of transistors 23 and 260 are zero, the source voltages could be negative by more than the threshold voltages. This could allow voltage onto reference voltage bus 11 which could damage components connected to bus 11. Moreover, if reference voltage bus 11 is in use (with another pin 101 and its respective circuit 20 configured as the reference pin), then the voltage on bus 11 could vary from the reference value, possibly adversely affecting operation of device 10, and/or damaging circuit elements connected to bus 11.

To prevent transistors 23 and 260 from conducting when they are not meant to, a reference voltage clamp circuit 26 is built around transistors 23 and 260. Clamp circuit 26 includes transistors 23 and 260, both of which are preferably NMOS field effect transistors having their gates connected to the output of level shift circuit 25. A pull-up transistor 261, preferably a PMOS field effect transistor, preferably is connected between a source of supply voltage $V_{cc}$ and the node 262 between transistors 23 and 260.

Thus, in reference pin mode, when the output of level shift circuit 25 is high, transistors 23, 260 are on, connecting pin 101 to bus 11. Pull-up transistor 261 is off, so that it does not affect operation of transistors 23, 260. In I/O mode, the output of level shift circuit 25 is low, so that transistors 23, 260 are off, isolating reference voltage bus 11 from pin 101 as expected. Pull-up transistor 261 is on, pulling up node 262 between transistors 23, 260. If the voltage on pin 101 goes negative and transistor 23 starts to conduct, the conduction path through transistors 261 and 23 form a voltage divider between $V_{cc}$ and the pin voltage. Proper sizing of the transistor on-resistances, and especially of resistor 21 if present, can assure that the voltage at node 263 remains positive, preventing conduction onto reference voltage bus 11.

Programmable I/O circuit 20 preferably also includes a so-called "hot socket" circuit 27 connected to transistors 23, 261 to prevent transistors 23, 261 from conducting while device 10 is being inserted into a socket with the power on, to prevent unpredictable operation before a steady state can be reached. "Hot socket" circuit 27 may be any conventional circuit available for such purposes.

Figure 3:
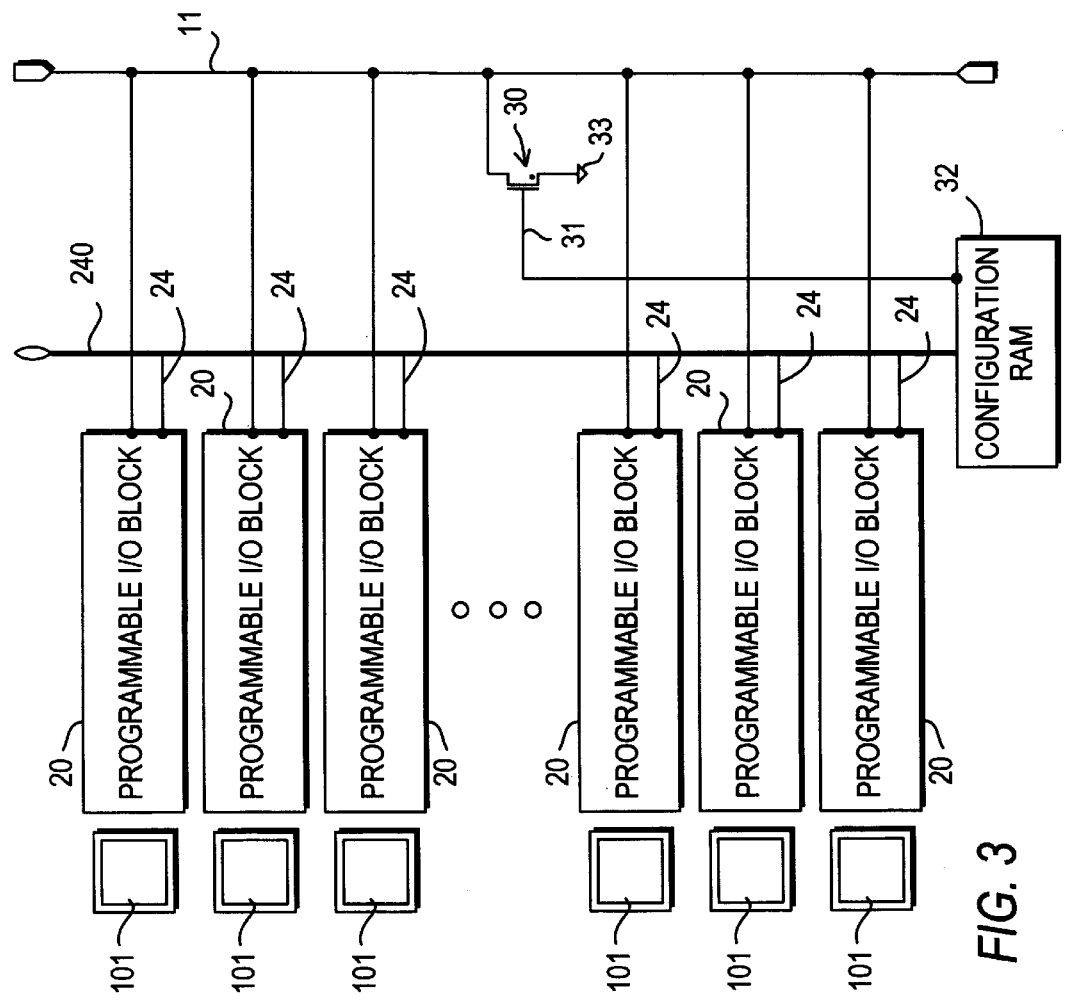
FIG. 3 is an enlarged schematic representation of a portion of the programmable logic device of FIG. 1.

If reference voltage bus 11 is not in use—i.e., none of circuits 20 is set to the reference voltage mode, then it may be desirable for reference voltage bus 11 to be at a known potential, rather than floating freely. Therefore, as seen in FIG. 3, which is an enlarged simplified view of device 10 omitting the programmable logic regions and conductors, a transistor 30 preferably is provided between reference voltage bus 11 and ground. Transistor 30 preferably has a gate 31 controlled by a programmable bit in configuration memory 32 of device 10. Configuration memory 32 also contains programmable bits that drive inputs 24 of circuits 20 via bus 240 to set each circuit 20 to operate in either reference voltage mode or standard I/O mode. When device 10 is configured so that none of circuits 20 is being used in a reference voltage mode, the bit that controls gate 31 preferably is programmed so that transistor 30 conducts, driving reference voltage bus 11 to ground 33. Alternatively, in another preferred embodiment (not shown), transistor 30 can be connected to a source (not shown) of known potential other than ground, such as $V_{cc}$; to drive reference voltage bus 11 to that potential. In a further preferred embodiment (not shown), a decoder circuit (not shown) could be provided that monitors the various signals 24 on bus 240, and if no signal 24 is high, the decoder circuit preferably drives reference voltage bus 11 to a known potential, such as, e.g., ground or $V_{cc}$.

Figure 4:
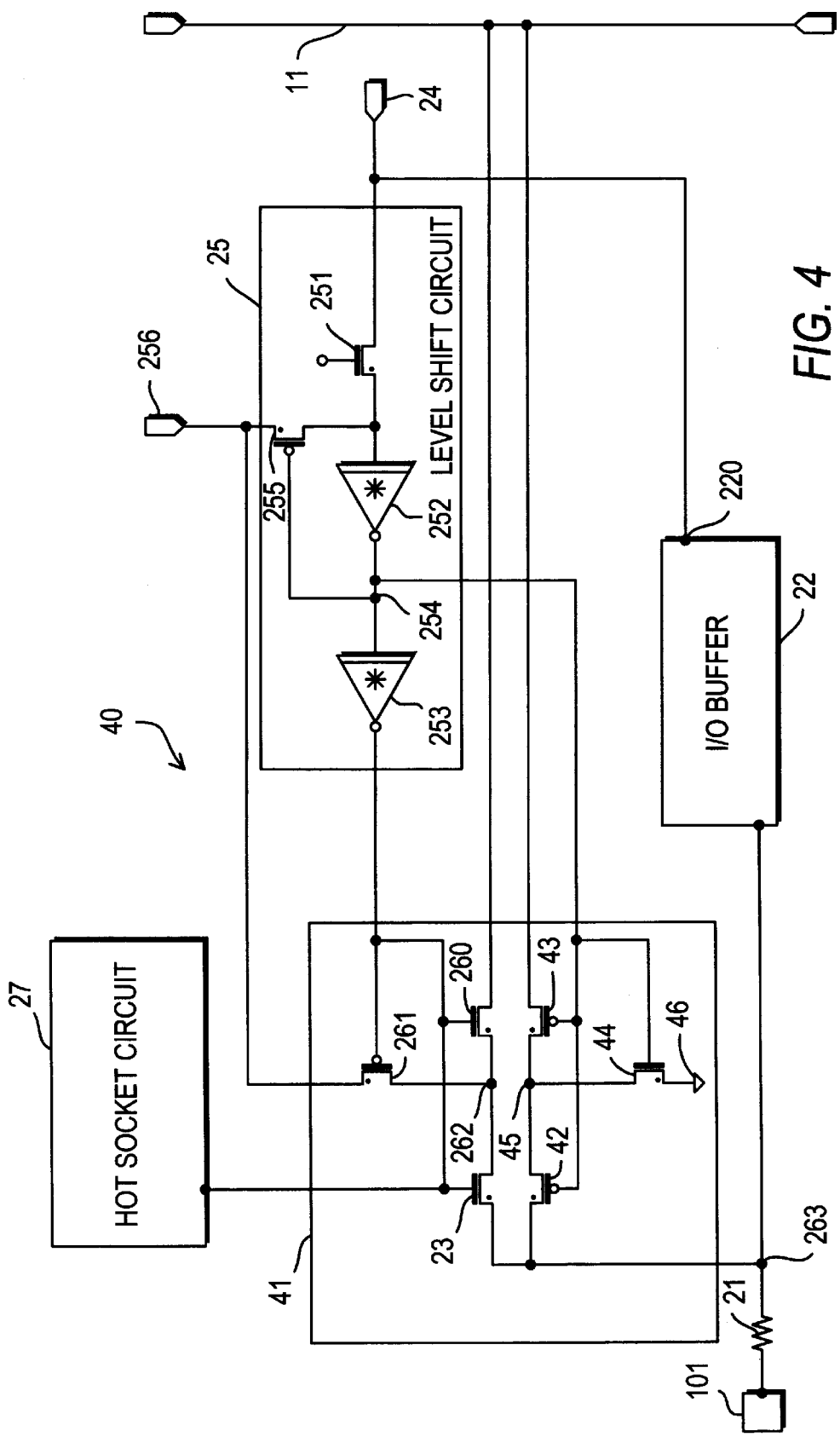
FIG. 4 is a schematic representation of a second preferred embodiment of a programmable I/O circuit according to the present invention.

Circuit 20 as shown in FIG. 2 functions to protect reference voltage bus 11 as described. However, the range of reference voltages that may be passed to bus 11 by circuit 20 may be limited, because as the reference voltage approaches $V_{cc}$, the gate to source voltage across transistor 23 would drop below the threshold voltage for conduction. In order to allow reference voltages approaching $V_{cc}$ in value, a second preferred embodiment of a programmable I/O circuit 40, shown in FIG. 4, may be provided. Circuit 40 is substantially identical to circuit 20, except that reference voltage clamp circuit 26 is replaced by reference voltage clamp circuit 41. Clamp circuit 41 differs from clamp circuit 26 in that, in addition to, and in parallel with, series-connected NMOS transistors 23, 261, circuit 41 preferably has series-connected PMOS transistors 42, 43. An NMOS pull-down transistor 44 preferably connects node 45 between transistors 42, 43 to ground 46. The gates of transistors 42, 43, 44 are controlled by node 254, instead of by the output of level shift circuit 25.

In reference mode, even as the reference voltage approaches $V_{cc}$, the gate to source voltage across transistor 42 will remain negative—indeed, it will become more strongly negative—and transistor 42 will continue to conduct the reference voltage to bus 11. In I/O mode, transistor 44 protects reference voltage bus 11 from overvoltages, which would tend to cause conduction onto bus 11, just as transistor 261 protects against undervoltages, by forming a conduction path and voltage divider to ground.

Figure 5:
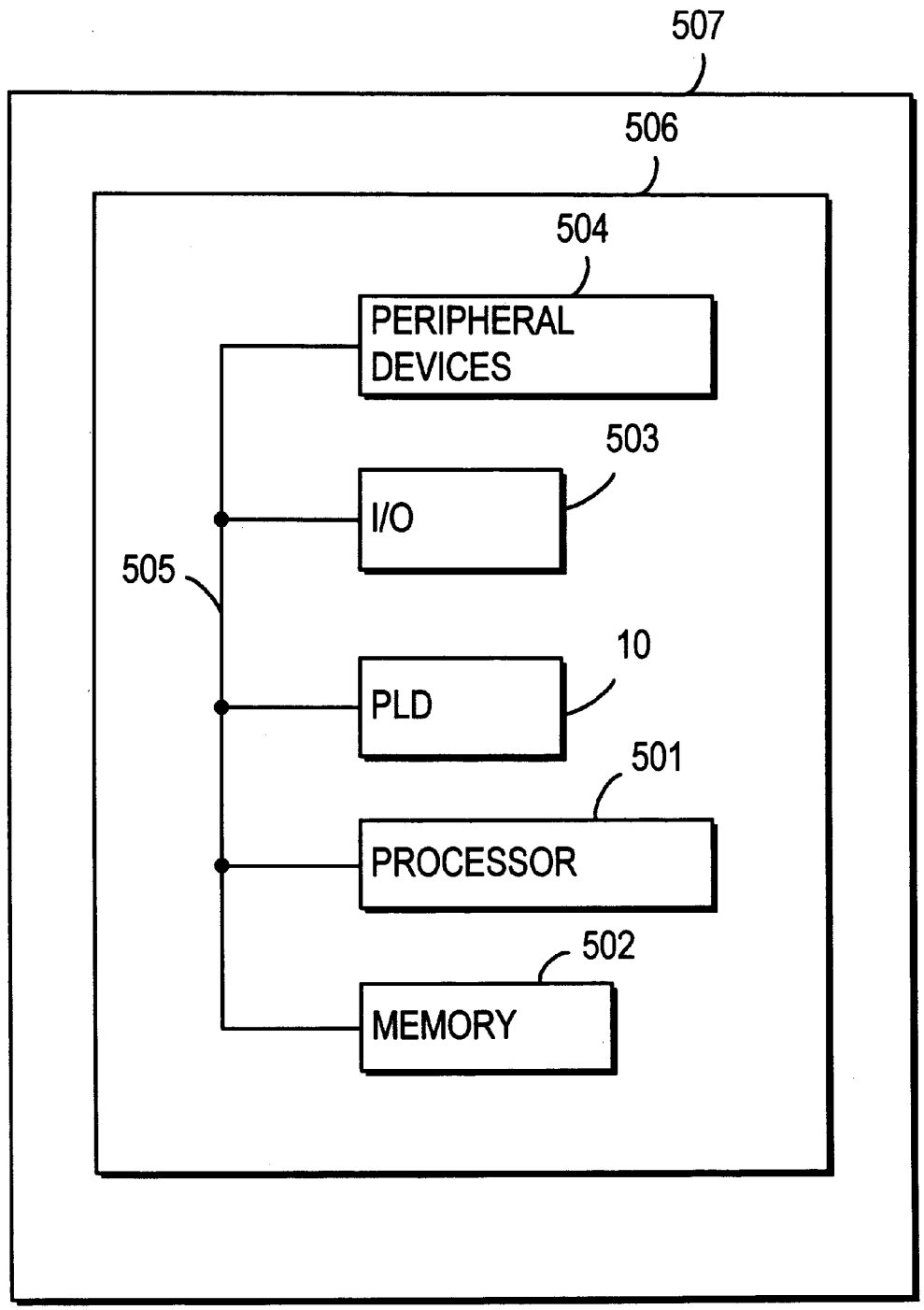
FIG. 5 is a simplified block diagram of an illustrative system employing a programmable logic device incorporating a programmable I/O circuit according to the present invention.

FIG. 5 illustrates a programmable logic device 10 incorporating programmable I/O circuits 20 or 40 configured according to this invention in a data processing system 500. Data processing system 500 may include one or more of the following components: a processor 501; memory 502; I/O circuitry 503; and peripheral devices 504. These components are coupled together by a system bus 505 and are populated on a circuit board 506 which is contained in an end-user system 507.

System 500 can be used in a wide variety of applications, such as computer networking, data networking, instrumentation, video processing, digital signal processing, or any other application where the advantage of using programmable or reprogrammable logic is desirable. Programmable logic device 10 can be used to perform a variety of different logic functions. For example, programmable logic device 10 can be configured as a processor or controller that works in cooperation with processor 501. Programmable logic device 10 may also be used as an arbiter for arbitrating access to a shared resource in system 500. In yet another example, programmable logic device 10 can be configured as an interface between processor 501 and one of the other components in system 500. It should be noted that system 500 is only exemplary, and that the true scope and spirit of the invention should be indicated by the following claims.

Various technologies can be used to implement programmable logic devices 10 employing the programmable I/O circuit 20 or 40 according to this invention, as well as the various components of the programmable I/O circuits. Moreover, this invention is applicable to both one-time-only programmable and reprogrammable devices.

Thus it is seen that an I/O circuit for a programmable logic device, which circuit is programmably configurable either as a standard I/O driver circuit or as a reference voltage input circuit, that in the standard I/O mode protects the reference voltage bus of the programmable logic device in the event that the I/O signal strays to an unexpected voltage value, has been provided. One-skilled in the art will appreciate that the present invention can be practiced by other than the described embodiments, which are presented for purposes of illustration and not of limitation, and the present invention is limited only by the claims which follow.

What is claimed is:

1. For use in a programmable logic device having reference voltage circuitry, a programmable input/output circuit comprising:

an input/output terminal;

an input/output buffer coupled to said input/output terminal for buffering input/output signals between said input/output terminal and other circuitry of said programmable logic device; and a programmable reference voltage clamp circuit for controllably passing a reference voltage from said input/output terminal to reference voltage circuitry of said programmable logic device; wherein:

when said programmable reference voltage clamp is controlled to pass said reference voltage from said input/output terminal to said reference voltage circuitry, said input/output buffer is disconnected from said input/output terminal to prevent conduction of said reference voltage to said other circuitry of said programmable logic device; and when said programmable reference voltage clamp is controlled to prevent conduction of said reference voltage from said input/output terminal to said reference voltage circuitry, said input/output buffer is connected to said input/output terminal to allow conduction of said reference voltage to said other circuitry of said programmable logic device.

2. A programmable logic device comprising:

programmable logic elements;

an interconnect structure connecting said programmable logic elements;

a plurality of input/output pins connected to said interconnect structure;

a reference voltage bus; and at least one respective programmable input/output circuit associated with a respective one of said input/output pins, said programmable input/output circuit comprising:

an input/output terminal connected to said one of said input/output pins, an input/output buffer coupled to said input/output terminal for buffering input/output signals between said input/output terminal and other circuitry of said programmable logic device, and a programmable reference voltage clamp circuit for controllably passing a reference voltage from said input/output terminal to reference voltage circuitry of said programmable logic device; wherein:

when said programmable reference voltage clamp is controlled to pass said reference voltage from said input/output terminal to said reference voltage circuitry, said input/output buffer is disconnected from said input/output terminal to prevent conduction of said reference voltage to said other circuitry of said programmable logic device; and when said programmable reference voltage clamp is controlled to prevent conduction of said reference voltage from said input/output terminal to said reference voltage circuitry, said input/output buffer is connected to said input/output terminal to allow conduction of said reference voltage to said other circuitry of said programmable logic device.

3. A digital processing system comprising:

processing circuitry;

a system memory coupled to said processing circuitry; and a programmable logic device as defined in claim 2 coupled to the processing circuitry and the system memory.

4. A printed circuit board on which is mounted a programmable logic device as defined in claim 2.

5. The printed circuit board defined in claim 4, further comprising:

a board memory mounted on the printed circuit board and coupled to the programmable logic device.

6. The printed circuit board defined in claim 5 further comprising:

processing circuitry mounted on the printed circuit board and coupled to the board memory.

7. An integrated circuit comprising:

an integrated circuit programmable logic device comprising:

programmable logic elements;

an interconnect structure connecting said programmable logic elements;

a plurality of input/output leads connected to said interconnect structure;

a reference voltage bus; and at least one respective programmable input/output circuit associated with a respective one of said input/output leads, said programmable input/output circuit comprising:

an input/output terminal connected to said one of said input/output leads, an input/output buffer coupled to said input/output terminal for buffering input/output signals between said input/output terminal and other circuitry of said programmable logic device, and a programmable reference voltage clamp circuit for controllably passing a reference voltage from said input/output terminal to reference voltage circuitry of said programmable logic device; wherein:

when said programmable reference voltage clamp is controlled to pass said reference voltage from said input/output terminal to said reference voltage circuitry, said input/output buffer is disconnected from said input/output terminal to prevent conduction of said reference voltage to said other circuitry of said programmable logic device; and when said programmable reference voltage clamp is controlled to prevent conduction of said reference voltage from said input/output terminal to said reference voltage circuitry, said input/output buffer is connected to said input/output terminal to allow conduction of said reference voltage to said other circuitry of said programmable logic device.

8. A digital processing system comprising:

processing circuitry;

a system memory coupled to said processing circuitry; and an integrated circuit as defined in claim 7 coupled to the processing circuitry and the system memory.

9. A printed circuit board on which is mounted an integrated circuit as defined in claim 7.

10. The printed circuit board defined in claim 9 further comprising:

a board memory mounted on the printed circuit board and coupled to the integrated circuit.

11. The printed circuit board defined in claim 10 further comprising:

processing circuitry mounted on the printed circuit board and coupled to the board memory.

\* \* \* \* \*